United States Patent
Oshino

[11] Patent Number: 5,952,682
[45] Date of Patent: *Sep. 14, 1999

[54] SEMICONDUCTOR DEVICE WITH DEEP ANODE AND LIFETIME REDUCTION REGION

[75] Inventor: Yuichi Oshino, Tokyo, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/767,337

[22] Filed: Dec. 16, 1996

[30] Foreign Application Priority Data

Dec. 19, 1995 [JP] Japan .................................. 7-330415

[51] Int. Cl.⁶ .......................... H01L 29/74; H01L 31/036
[52] U.S. Cl. .......................... 257/156; 257/155; 257/147; 257/341
[58] Field of Search .................................. 257/155, 156, 257/147, 341

[56] References Cited

U.S. PATENT DOCUMENTS

| 4,972,239 | 11/1990 | Mihara | 257/341 |
| 5,023,696 | 6/1991 | Ogino | 257/156 |
| 5,068,704 | 11/1991 | Nakagawa | 257/147 |

FOREIGN PATENT DOCUMENTS

| 0 430 237 | 6/1991 | European Pat. Off. . |
| 2 150 753 | 7/1985 | United Kingdom . |
| 2 258 564 | 2/1993 | United Kingdom . |

OTHER PUBLICATIONS

Solid State Electronics, vol. 35, No. 5, pp. 681–685, May 1, 1992, T. Laska, et al., "A 2000 V Non–Punchthrough IGBT with High Ruggedness".

Electric Design, vol. 43, No. 23, pp. 37/38, Nov. 6, 1995, Frank Goodenough, "New Float–Zone Process UPS Switching Rate of IGBT's and Also Cuts Their Fabrication Cost".

Journal of Applied Physics, vol. 67, No. 11, pp. 6764–6771, Jun. 1, 1990, G. Zoth, et al., "A Fast, Preparation–Free Method to Detect Iron in Silicon".

*Primary Examiner*—Jerome Jackson, Jr.
*Attorney, Agent, or Firm*—Oblon, Spivak, McClelland, Maier & Neustadt, P.C.

[57] ABSTRACT

A semiconductor device has a low lifetime layer in a selective portion of an N-type drain region to prevent a change in the element characteristic due to Fe contaminants, even if the device is kept at a high temperature. An impurity of a concentration of at least $10^{16}$ atoms/cm³ is deposited on a first main surface of the N-type drain region, and diffused into the region to a depth of 10 μm, thereby forming a P-type anode region. An anode metal electrode is formed on the surface of the anode region. A P-type base region and an N-type source region are formed in a second main surface of the N-type drain region by ion injection or the like. A gate electrode is formed above the second main surface with a gate oxide film interposed therebetween. A metal gate electrode is formed in contact with the gate electrode. A source metal electrode is formed on the source region and the base region so as to short-circuit them. The low lifetime layer is formed in a selective portion of the N-type drain region.

3 Claims, 3 Drawing Sheets

SEMICONDUCTOR DEVICE WITH DEEP ANODE AND LIFETIME REDUCTION REGION

BACKGROUND OF THE INVENTION

The present invention relates to a semiconductor device of a non-punch-through type, and more particularly to a reliable semiconductor device which can suppress a fluctuation in ON voltage.

IGBTs (Integrated Gate Bipolar Transistors) are classified into a punch-through type and a non-punch-through type. FIG. 1 is a cross-sectional view of a conventional non-punch-through type IGBT of a withstand voltage of 1700 V.

The conventional non-punch-through type IGBT has an N-type drain region (substrate) 2 and a P-type anode region 4 formed on a first main surface of the drain region 2 by impurity diffusion or the like. A P-type base region 6 is formed in the N-type drain region 2, and further an N-type source region 8 is formed in the region 6. The regions 6 and 8 are also formed by impurity diffusion or the like.

A thin oxide film 10 is formed on a second main surface of the drain region 2. A polysilicon gate electrode 12 is formed on the thin oxide film 10. A metal gate electrode 14 is formed in contact with the polysilicon gate electrode 12. A source metal electrode 16 is formed on the source region 8 and the base region 6 so as to short-circuit them.

A metal anode electrode 18 is formed in contact with the P-type anode region 4. To suppress injection of holes from the P-type anode region 4, in consideration of the structure of the element region, the thinner the diffusion into the anode region 4, the better the characteristic of the IGBT.

The IGBT as shown in FIG. 1, however, is easily affected by the impurity of the surface region. When the IGBT element is kept at a high temperature for a long period of time, Fe contained in the metal electrode is diffused into the substrate. As result, Fe ions and B ions are coupled in a region of the P-type anode region 4 of a low concentration, forming FeB in this region.

FIG. 2 is a graph showing the relationship between the temperature and the ratio of the concentration of Fe ions to that of B ions, disclosed in *J. Appl. Phys.*, Vol. 67, No. 11, Jun. 1, 1990, "A fast, preparation-free method to detect iron in silicon". In the graph, the increase of the value of $Fe_1/Fe$ means the increase of the amount of FeB.

As shown in FIG. 2, since the amount of FeB in the P-type anode region 4 increases with the rise in temperature, the energy level is changed. Consequently, the lifetime of carriers is also changed, resulting in a problem that stable element characteristics cannot be obtained.

To solve the above problem, the anode region 4 may be formed thick, and the surface portion of the region may have a concentration enough to form an ohmic contact. In this case, however, the amount of holes injected from the anode region into the substrate is increased. As a result, the element characteristics may be considerably changed.

BRIEF SUMMARY OF THE INVENTION

It is accordingly an object of the present invention to provide a semiconductor device having a satisfactory switching characteristic, which prevents a change in the element characteristics due to Fe contaminants, even if the device is kept at a high temperature.

According to a first aspect of the present invention, there is provided a non-punch-through type IGBT semiconductor device comprising a drain region of a first conductivity type, an anode region of a second conductivity type formed on a first main surface of the drain region, a source region of the first conductivity type formed on a second main surface the drain region, a base region of the second conductivity type formed on the second main surface of the drain region, and a gate electrode formed on the second main surface of the drain region, wherein: a low lifetime layer is formed in a selective portion of the drain region; and the anode region has a depth of at least 7 µm from the first main surface of the drain region and an impurity concentration of at least $10^{16}$ atoms/cm$^3$.

According to a second aspect of the present invention, there is provided a non-punch-through type IGBT semiconductor device comprising a drain region of a first conductivity type, an anode region of a second conductivity type formed on a first main surface of the drain region, a source region of the first conductivity type formed on a second main surface the drain region, a base region of the second conductivity type formed on the second main surface of the drain region, and a gate electrode formed on the second main surface of the drain region, wherein: a low lifetime layer is formed in a selective portion of the drain region; and the anode region has a depth and an impurity concentration which prevent diffusion of Fe into the anode region.

In the semiconductor device according to the first aspect of the present invention, the anode region of the second conductivity type is formed on the first main surface of the semiconductor substrate of the first conductivity type and a MOS structure is formed on the second main surface of the substrate. The depth of the anode region is at least 7 µm and the concentration thereof is at least $10^{16}$ atoms/cm$^3$. In addition, the low lifetime layer is formed in a central portion of the drain region (the semiconductor substrate of the first conductivity type), nearer to the anode region, between the base region and the anode region.

In the semiconductor device according to the second aspect of the present invention, the anode region of the second conductivity type is formed on the first main surface of the semiconductor substrate of the first conductivity type and a MOS structure is formed on the second main surface of the substrate. The low lifetime layer is formed in a selective portion of the drain region. The anode region has a depth and an impurity concentration which prevent diffusion of Fe into the anode region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4C are characteristic diagrams, each showing a regulation with time of an ON voltage in the anode depths of 2 μm, 5 μm and 7 μm, when the IGBT shown in FIG. 3 is kept at a high temperature (125° C.), in which FIG. 4A shows a case of the anode concentration of $10^{15}$ atoms/cm$^3$, FIG. 4B shows a case of the anode concentration of $10^{16}$ atoms/cm$^3$, and FIG. 4C shows a case of the anode concentration of $10^{17}$ atoms/cm$^3$.

DETAILED DESCRIPTION OF THE INVENTION

An embodiment of the present invention will be described with reference to the accompanying drawings.

Figures 1, 3:
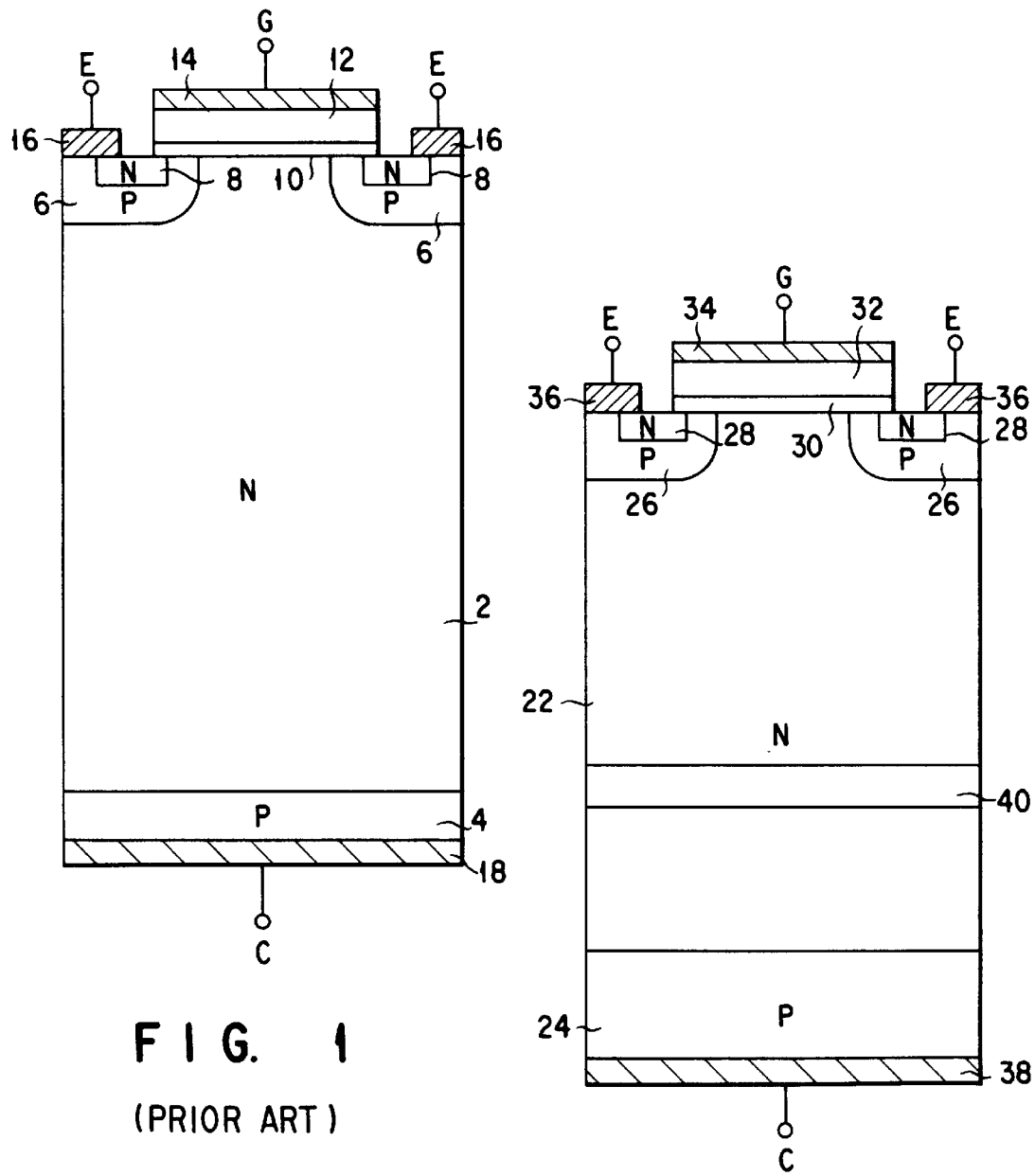
FIG. 1 is a cross-sectional view showing a conventional non-punch-through type IGBT.
FIG. 3 is a cross-sectional view showing an IGBT semiconductor device according to an embodiment of the present invention.

FIG. 3 is a cross-sectional view showing an IGBT semiconductor device according to an embodiment of the present invention.

The IGBT shown in FIG. 3 is formed as follows. An impurity, such as boron, of a concentration of $10^{16}$ atoms/cm$^3$ or higher is deposited on a first main surface of an N-type drain region (N-type semiconductor substrate) 22 and diffused to a depth of 10 μm, thereby forming a P-type anode region 24. As will be described in detail later, the P-type anode region is formed to a depth of at least 7 μm from said main surface of the N-type drain region.

An impurity, such as boron, is diffused into a second main surface of the N-type drain region 22 by selective ion injection or the like, thereby forming a P-type base region 26. An impurity, such as arsenic, is diffused into the P-type base region 26 by selective ion injection or the like. Then, a gate oxide film 30 of a thickness of about 100 nm is formed on the second main surface of the N-type. Further, a polysilicon 32, serving as a gate electrode, is deposited and patterned on the gate oxide film 30.

Thereafter, an insulating film is formed on the overall region of the second main surface. The insulating film is selectively removed to form portions where the N-type source region 28 and the polysilicon 32 are respectively connected to metal electrodes. Subsequently, a metal, e.g., Al, is sputtered on the overall region of the second main surface, and then patterned to form a source metal electrode 34 and a gate metal electrode 36.

A metal, e.g., Au, is sputtered on the surface of the P-type anode region 24, thereby forming an anode metal electrode 38. A known low lifetime layer 40, serving as a region to stop charged particles, is formed in a selective portion of the N-type drain region 22. The low lifetime layer 40 is formed in a position to which a depletion layer extending in the N-type drain region 22 does not reach on a rated voltage.

Figure 4A:
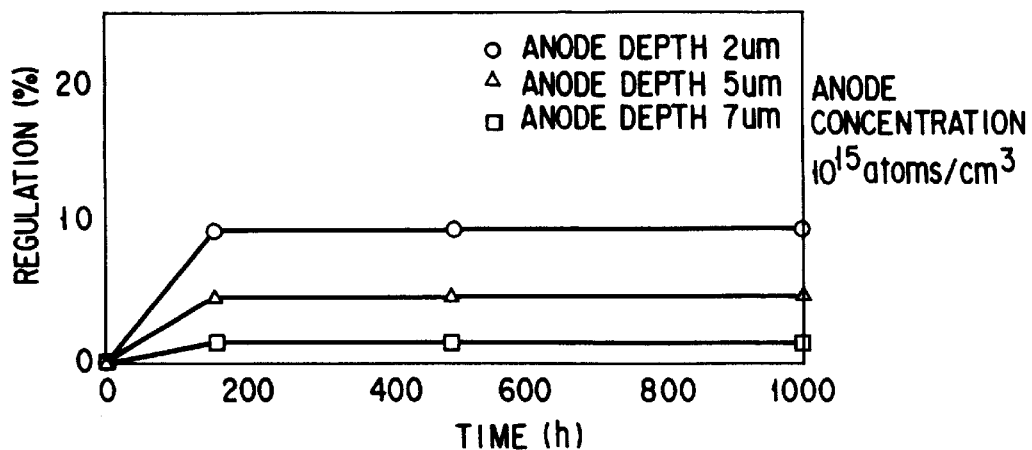
Figure 4B:
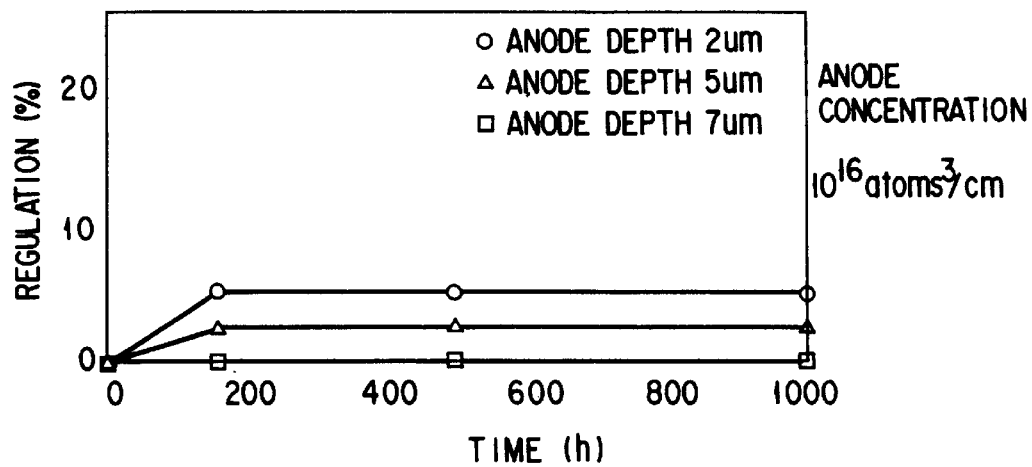
Figure 4C:
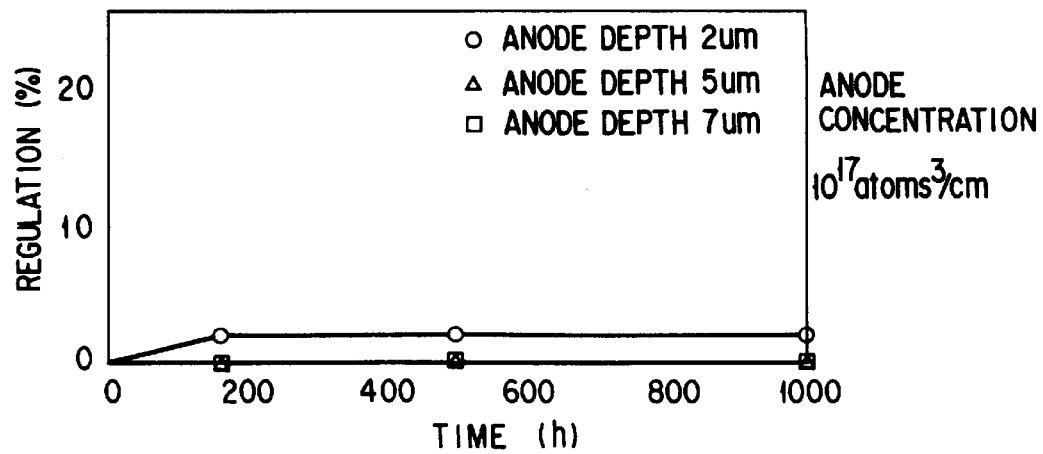

FIGS. 4A to 4C are characteristic diagrams, each showing a regulation with time of an ON voltage in the anode depths of 2 μm, 5 μm and 7 μm, when the IGBT shown in FIG. 3 is kept at a high temperature (125° C.). FIG. 4A shows a result of an experiment wherein the anode concentration is $10^{15}$ atoms/cm$^3$, FIG. 4B shows a result of an experiment wherein the anode concentration is $10^{16}$ atoms/cm$^3$, and FIG. 4C shows a result of an experiment wherein the anode concentration is $10^{17}$ atoms/cm$^3$.

As shown in FIGS. 4A to 4C, in the IGBTs of the anode depths of 2 μm and 5 μm, the regulations are relatively high in the cases of the anode concentrations of $10^{15}$ atoms/cm$^3$ and $10^{16}$ atoms/cm$^3$. In contrast, in the IGBT of the anode depth of 7 μm, the regulation is changed little in any case of the anode concentrations of $10^{15}$ atoms/cm$^3$, $10^{16}$ atoms/cm$^3$ and $10^{17}$ atoms/cm$^3$.

Thus, it is proved from the experiments that fluctuation can be suppressed, if the depth of the anode is 7 μm or more. This means that even if FeB is qualitatively formed, it is not diffused to a portion near the junction between the anode and the drain.

Figure 2:
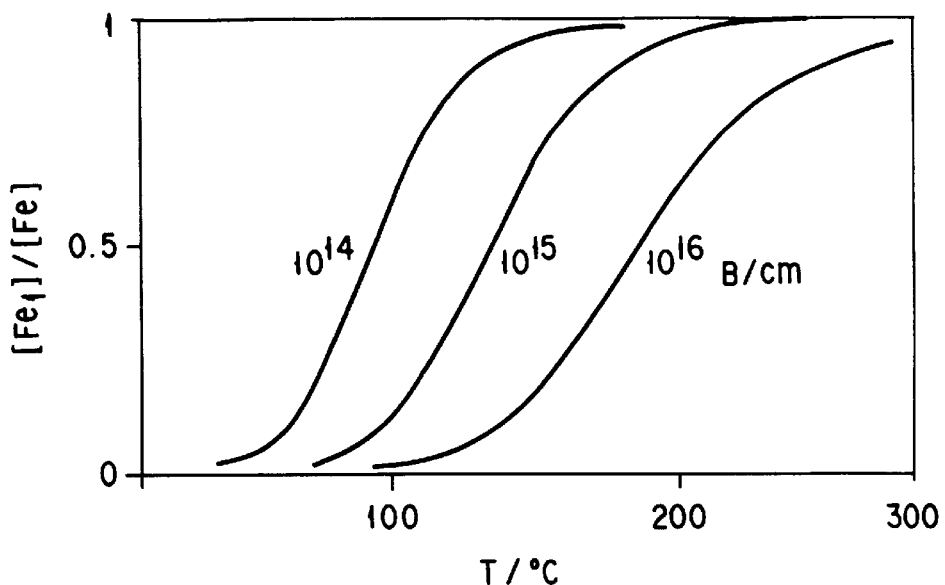
FIG. 2 is a graph showing the relationship between the temperature and the ratio of the concentration of Fe ions to that of B ions.
Figure 5:
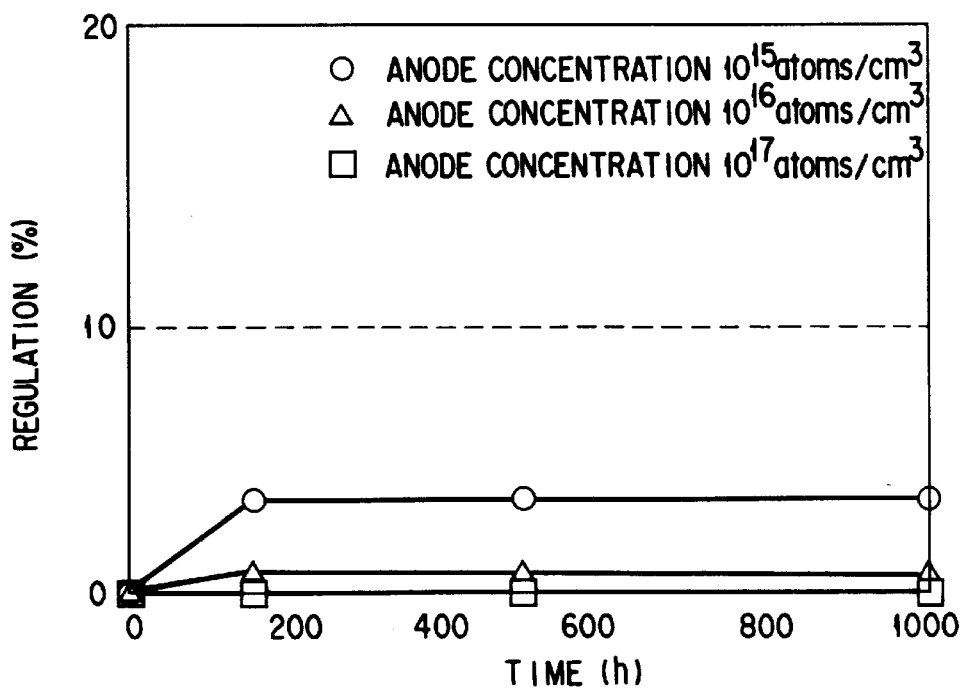
FIG. 5 is a characteristic diagram showing a regulation with time of an ON voltage in the anode depth of 7 μm, using the anode concentrations as parameters, when the IGBT is kept at a high temperature (125° C.).

FIG. 5 is a characteristic diagram showing a regulation with time of an ON voltage in the anode depth of 7 μm, using the anode concentrations as parameters, in an experiment in which the IGBT is kept at a high temperature (125° C.). As can be understood from FIG. 5, the experiment proves that when the guaranteed temperature of the element is 125° C. or lower, the anode concentration to reduce the amount of FeB is at least $10^{16}$ atoms/cm$^3$, as compared to the conventional IGBT having the anode concentration of $10^{15}$ atoms/cm$^3$. This is also supported by the prior art document which discloses the graph shown in FIG. 2.

In the case shown in FIG. 5, if the low lifetime layer 40 is formed in a region where a depletion layer is extending, a leak current may be slightly increased (in particular, at a high temperature). It is therefore desirable that the low lifetime layer 40 be formed in a selective portion so as not to reach to the depletion layer which extends when a rated voltage is applied to the element.

In the above embodiment, the P-type anode region 24 is formed by diffusion, after boron is deposited. However, it may be diffused by injecting boron by ion injection. Thereafter, a low lifetime layer is formed in a central portion of the drain region, nearer to the anode region, between the base region and the anode region. Charged particles of, e.g., proton, are stopped by the low lifetime layer.

With the above structure, the element is not affected by Fe ions in the metal electrode formed on the second surface of the substrate. Therefore, the element has a stable electrical characteristic and a satisfactory switching characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:

a drain region of a first conductivity type;

an anode region of a second conductivity type formed on a first main surface of the drain region;

a source region of the first conductivity type formed on a second main surface of the drain region;

a base region of the second conductivity type formed on the second main surface of the drain region;

a gate electrode formed on the second main surface of the drain region; and a low lifetime layer formed in the drain region;

wherein the anode region has a depth of at least 7 μm from the first main surface of the drain region and an impurity concentration of at least $10^{16}$ atoms/cm$^3$, and the drain region includes a depletion layer extending therein, which does not reach to the low lifetime layer when a rated voltage is applied.

2. A semiconductor device comprising:

a drain region of a first conductivity type;

an anode region of a second conductivity type formed on a first main surface of the drain region;

a source region of the first conductivity type formed on a second main surface of the drain region;

a base region of the second conductivity type formed on the second main surface of the drain region;

a gate electrode formed on the second main surface of the drain region; and a low lifetime layer formed in the drain region;

wherein the anode region has a depth of at least 7 μm from the first main surface of the drain region, and the drain region includes a depletion layer extending therein, which does not reach to the low lifetime layer when a rated voltage is applied.

3. The semiconductor device according to claim 2, wherein the anode region has an impurity concentration of at least $10^{16}$ atoms/cm$^3$.

* * * * *